United States Patent
Yamaguchi

(10) Patent No.: US 7,115,519 B2
(45) Date of Patent: Oct. 3, 2006

(54) METHOD FOR PLASMA TREATMENT

(75) Inventor: Tomoyo Yamaguchi, Goshogawara (JP)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 10/684,502

(22) Filed: Oct. 15, 2003

(65) Prior Publication Data

US 2004/0082185 A1 Apr. 29, 2004

(30) Foreign Application Priority Data

Oct. 15, 2002 (JP) ............................. 2002-300817

(51) Int. Cl.
*H01L 21/302* (2006.01)

(52) U.S. Cl. ................. 438/706; 438/714; 438/723
(58) Field of Classification Search ............... 438/706, 438/710, 712, 714, 723, 724, 725; 216/58, 216/63, 64, 67, 72, 79

See application file for complete search history.

(56) References Cited

U.S. PATENT DOCUMENTS

| | | | | |
|---|---|---|---|---|
| 5,627,395 A | * | 5/1997 | Witek et al. | 257/350 |
| 5,958,793 A | * | 9/1999 | Patel et al. | 438/689 |
| 6,009,830 A | * | 1/2000 | Li et al. | 118/723 R |
| 6,103,590 A | * | 8/2000 | Swanson et al. | 438/409 |
| 6,284,657 B1 | * | 9/2001 | Chooi et al. | 438/687 |
| 6,472,231 B1 | * | 10/2002 | Gabriel et al. | 438/9 |
| 6,617,244 B1 | * | 9/2003 | Nishizawa | 438/637 |
| 6,635,185 B1 | * | 10/2003 | Demmin et al. | 216/64 |
| 6,670,278 B1 | * | 12/2003 | Li et al. | 438/710 |
| 6,764,958 B1 | * | 7/2004 | Nemani et al. | 438/758 |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

A method for plasma treatment etches an SiC layer with an increased etching rate and enhanced selectivities of SiC with respect to $SiO_2$ and an organic layer. An etching gas is converted into plasma to etch SiC. The etching gas may include $CHF_3$; $CHF_3$ and $N_2$, for example, a mixed gas of $CHF_3$, $N_2$ and Ar; or a material having C, H and F and a material having N but without any material having O.

13 Claims, 4 Drawing Sheets

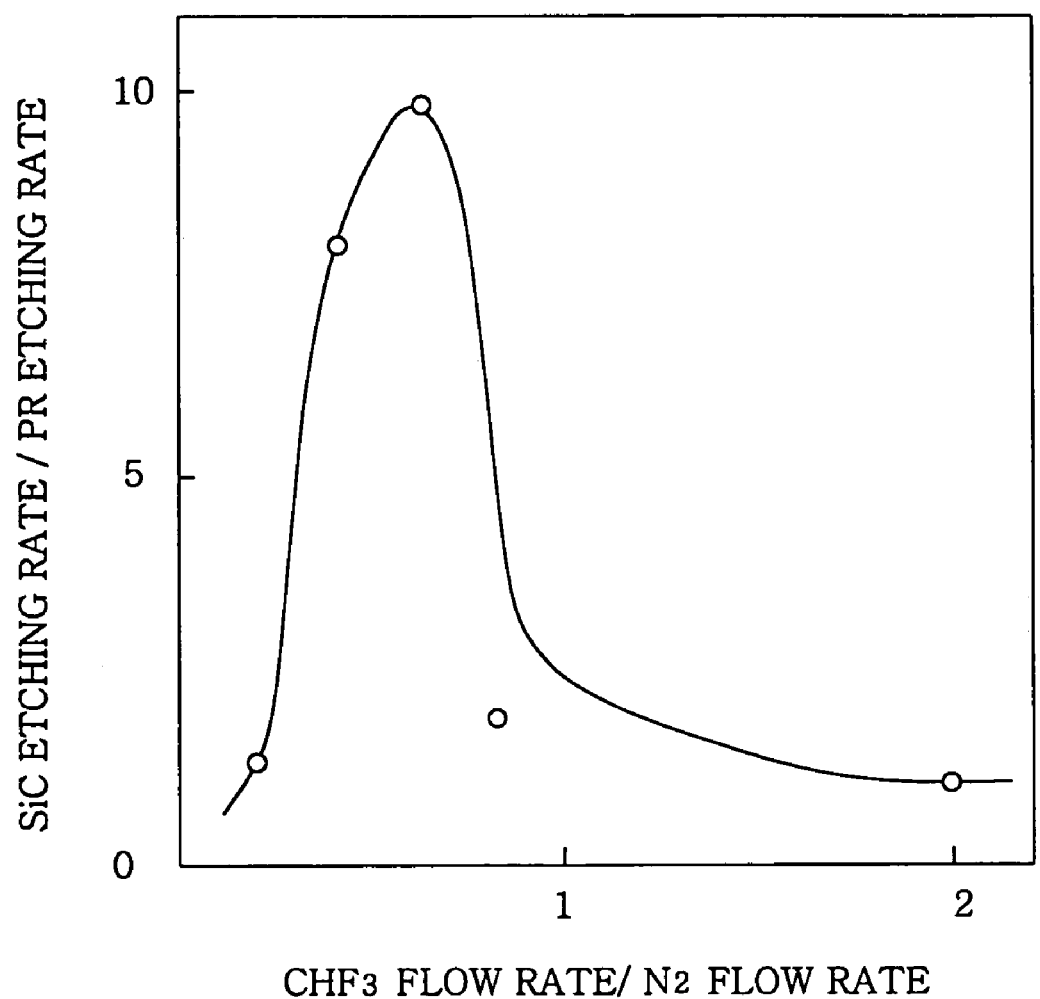

METHOD FOR PLASMA TREATMENT

FIELD OF THE INVENTION

The present invention relates to a method for manufacturing a semiconductor; and, more particularly, to a method for plasma etching treatment in a semiconductor manufacturing process.

BACKGROUND OF THE INVENTION

Japanese Patent Laid-Open Publication No. 1982-124438 discloses a mixed gas of $CF_4$ and $O_2$ used as an etching gas to etch SiC with a plasma treatment. Japanese Patent Laid-Open Publication No. 1987-216335 discloses another mixed gas of $CHF_3$ and $O_2$ used as etching gas to etch SiC with a plasma treatment.

However, these etching gases have a lower SiC etching rate, a lower etching selectivity of SiC with respect to $SiO_2$ (SiC etching rate over $SiO_2$ etching rate), and a lower etching selectivity of SiC with respect to an organic mask (SiC etching rate over an etching rate of the organic mask).

SUMMARY OF THE INVENTION

It is, therefore, an object of the present invention to provide a method for plasma treatment to etch SiC with an improved etching rate of SiC, enhanced etching selectivities of SiC with respect to $SiO_2$ and an organic material, respectively.

In accordance with the present invention, there is provided a method for plasma treatment, comprising the steps of:

(a) arranging a substrate into a chamber, wherein the substrate includes a SiC layer and a $SiO_2$ layer; and (b) introducing an etching gas into the chamber and converting the etching gas into plasma to etch the SiC layer selectively against the $SiO_2$ layer, wherein the etching gas includes $CHF_3$.

If the etching gas includes $CHF_3$, the etching selectivity of the SiC layer with respect to the $SiO_2$ layer (an etching rate of the SiC layer over an etching rate of the $SiO_2$ layer) increases. In case of using $CHF_3$ as the etching gas, it is less likely to have a so-called etching stop wherein the etching rate becomes 0 during the etching process, than in the cases of using $CH_2F_2$ and $CH_3F$, respectively.

Since the etching selectivity of the SiC layer with respect to the $SiO_2$ layer is high, the SiC layer is etched selectively against the $SiO_2$ layer although the $SiO_2$ layer on the substrate is exposed to the etching gas. Even if the $SiO_2$ layer functions as a mask layer of the SiC layer or even if the $SiO_2$ layer functions as a base layer of the SiC layer, the SiC layer may be etched selectively as described above.

It is preferable that the etching gas includes a material having N, because both the etching rate of the SiC layer and the etching selectivity of the SiC layer with respect to an organic layer increase when the etching gas includes the material having N. The material having N is preferably $N_2$, because $N_2$ is safe and manageable. A ratio of $CHF_3$ flow rate with respect to $N_2$ flow rate ($CHF_3$ flow rate over $N_2$ flow rate) in the etching gas is preferably between about 0.2 and about 0.6 and more preferably between about 0.4 and about 0.6. In the latter case, the etching selectivity of the SiC layer with respect to the $SiO_2$ layer is considerably high.

In accordance with the present invention, there is provided another method for plasma treatment, comprising the steps of:

(a) arranging a substrate in a chamber, wherein the substrate includes an SiC layer; and (b) introducing an etching gas having $CHF_3$ and $N_2$ in the chamber and converting the etching gas into plasma to etch the SiC layer.

If the etching gas includes $CHF_3$ and $N_2$, the etching rate of the SiC layer increases. The ratio of $CHF_3$ flow rate with, respect to $N_2$ flow rate in the etching gas is preferably between about 0.2 and about 0.8, more preferably between about 0.4 and about 0.8 and still more preferably between about 0.4 and about 0.6. In the latter case, the etching rate of the SiC layer is considerably high.

If the etching gas includes $CHF_3$ and $N_2$, the etching selectivity of the SiC layer with respect to an organic layer increases so that the SiC layer is etched selectively against the organic layer. Specifically, in such cases where the organic layer is exposed in the substrate, or where the organic layer is a mask layer of the SiC layer, or where the organic layer is a base layer of the SiC layer, the SiC layer may be etched selectively. The ratio of $CHF_3$ flow rate with respect to $N_2$ flow rate in the etching gas is preferably between about 0.2 and about 0.8 and more preferably between about 0.4 and about 0.6. In the latter case, the etching selectivity of the SiC layer with respect to the organic layer is considerably high. A dielectric layer with a lower dielectric constant may be preferably used as the organic layer for the manufacture of high performance devices.

If the etching gas includes $CHF_3$ and $N_2$, the etching selectivity of the SiC layer with respect to the $SiO_2$ layer may increase so that the SiC layer is etched selectively against the $SiO_2$ layer. Specifically, in such cases where the $SiO_2$ layer is exposed in the substrate, or where the $SiO_2$ layer is a mask layer of the SiC layer, or where the $SiO_2$ layer is a base layer of the SiC layer, the SiC layer may be etched selectively. The ratio of $CHF_3$ flow rate with respect to $N_2$ flow rate in the etching gas is preferably between about 0.2 and about 0.6 and more preferably between about 0.4 and about 0.6. In the latter case, the etching selectivity of the SiC layer with respect to the $SiO_2$ layer is considerably high.

In accordance with the present invention, there is provided another method for plasma treatment, comprising the steps of:

(a) arranging a substrate in a chamber, wherein the substrate includes an SiC layer; and (b) introducing an etching gas in the chamber and converting the etching gas into plasma to etch the SiC layer, wherein the etching gas includes a material having C, H and F and a material having N, the etching gas being essentially free from any material having O.

If the etching gas includes a material having C, H and F and a material having N but without any material having O, the etching rate of the SiC layer may increase. The material having C, H and F is preferably $CHF_3$ and the material having N is preferably $N_2$. The ratio of $CHF_3$ flow rate with respect to $N_2$ flow rate in the etching gas is preferably between about 0.2 and about 0.8, more preferably between about 0.4 and about 0.8 and still more preferably between about 0.4 and about 0.6. In the latter case, the etching rate of the SiC layer is considerably high.

If the etching gas includes a material having C, H and F and a material having N but the etching gas is completely or essentially free from any material having O, the SiC layer may be etched selectively against an organic layer. Specifically, in such cases where the organic layer is exposed in the substrate, or where the organic layer is a mask layer of the SiC layer, or where the organic layer is a base layer of the SiC layer, the SiC layer may be etched selectively. The material having C, H and F is preferably $CHF_3$ and the material having N is preferably $N_2$. The ratio of $CHF_3$ flow rate to $N_2$ flow rate in the etching gas is preferably between about 0.2 and about 0.8 and more preferably between about 0.4 and about 0.6. In case of the latter range, the etching selectivity of the SiC layer with respect to the organic layer is considerably high. A dielectric layer with a lower dielectric constant may be preferably used as the organic layer for the manufacture of high performance devices.

If the etching gas includes a material having C, H and F and a material having N while the etching gas is completely or essentially free from any material having O, the SiC layer is etched selectively against the $SiO_2$ layer. Specifically, in cases where the $SiO_2$ layer is exposed in the substrate, or where the $SiO_2$ layer is a mask layer of the SiC layer, or where the $SiO_2$ layer is a base layer of the SiC layer, the SiC layer may be etched selectively. The material having C, H and F is preferably $CHF_3$ and the material having N is preferably $N_2$. The ratio of $CHF_3$ flow rate with respect to $N_2$ flow rate in the etching gas is preferably between about 0.2 and about 0.6 and more preferably between about 0.4 and about 0.6. In the latter case, the etching selectivity of the SiC layer with respect to the $SiO_2$ layer is considerably high.

As described above, since the etching gas is completely or essentially free from any material having O, e.g., $O_2$ or CO, Cu may be prevented from being oxidized during the etching process although a Cu layer may be used as a base layer of the SiC layer.

BRIEF DESCRIPTION OF THE DRAWINGS

The above and other objects and features of the present invention will become apparent from the following description of preferred embodiments given in conjunction with the accompanying drawings, in which:

FIG. 5 depicts a graphic illustration showing a relationship between an etching selectivity of the SiC layer with respect to the photoresist (PR) layer and a ratio of $CHF_3$ flow rate with respect to $N_2$ flow rate.

DETAILED DESCRIPTION OF PREFERRED EMBODIMENTS

Figure 1:
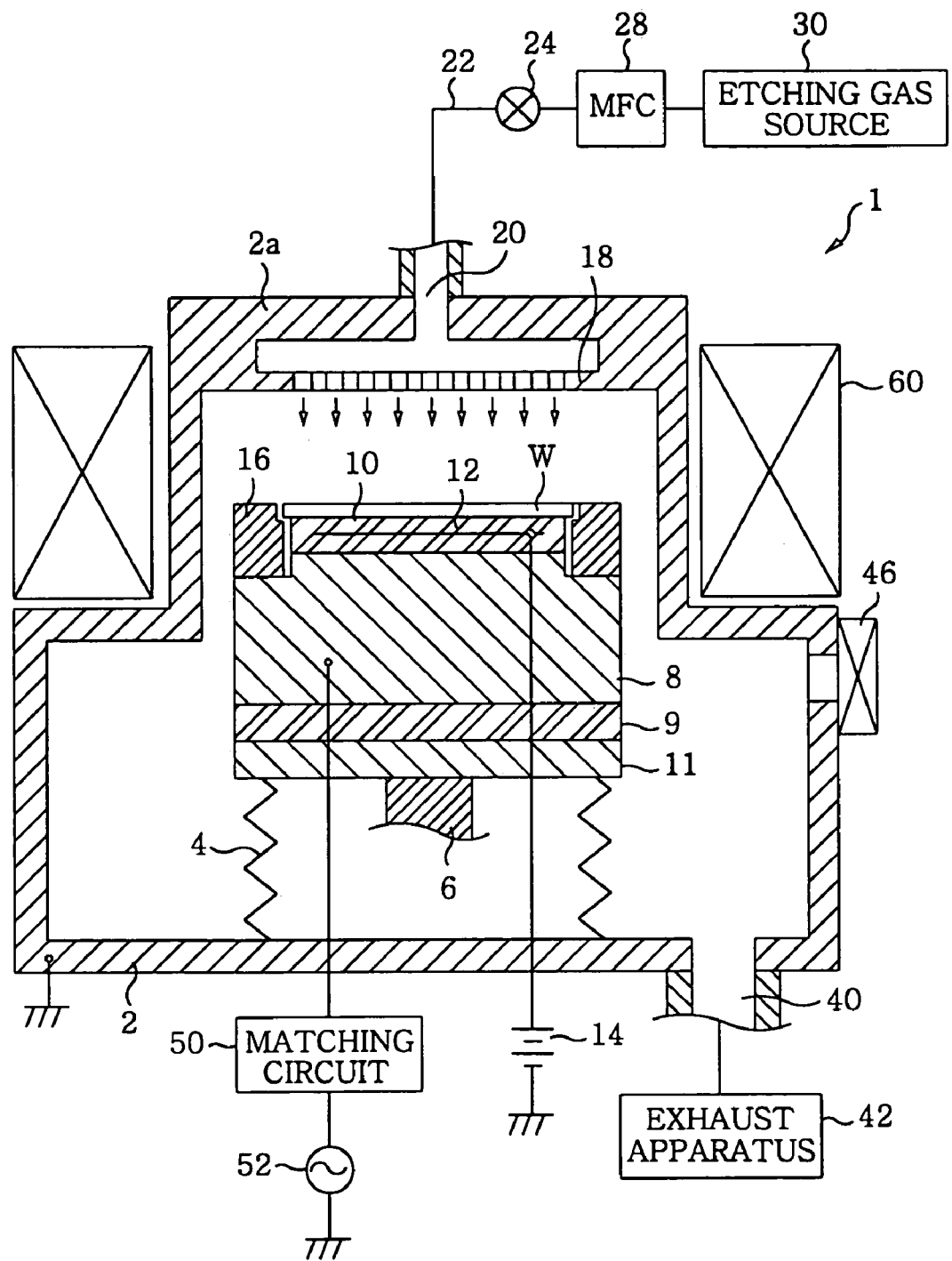
FIG. 1 shows a schematic cross-sectional view of a plasma etching apparatus for processing a plasma treatment method in accordance with the present invention.

FIG. 1 illustrates a cross-sectional view for a plasma etching apparatus 1 for processing a plasma treatment in accordance with an embodiment of the present invention. A processing chamber 2 is composed of metal, e.g., surface oxidized aluminum and is grounded. An elevator 6, a conductor 11, an insulator 9 and a susceptor 8 are formed sequentially and vertically on a bottom portion of the processing chamber 2. A conducting bellows surrounds the elevator 6. The susceptor 8 functions as a bottom electrode of parallel plate electrodes. The conductor 11 is grounded through the bellows 4, while the susceptor 8 and the conductor 11 are electrically insulated by the insulator 9 inserted between the susceptor 8 and the conductor 11. The susceptor 8, which functions as the bottom electrode, is coupled through a matching circuit 50 with a high frequency power source 52.

An electrostatic chuck 10 is installed on the susceptor 8. A substrate W such as a semiconductor wafer is loaded on the electrostatic chuck 10. The electrostatic chuck 10 is an insulator with an electrode 12 inserted therein. If a DC voltage output from a DC power source 14 is applied to the electrode 12, Coulomb's electrostatic force formed by the DC voltage attracts the substrate W. The substrate W is surrounded by a focus ring 16. The focus ring 16 is formed of, e.g., Si and $SiO_2$ and serves to improve the etching uniformity.

A top electrode 18 is located on an opposite side of the susceptor 8. The top electrode 18 is secured onto an upper part 2a of the processing chamber 2. That is, the upper part 2a of the processing chamber 2 functions as the top electrode of the parallel plate electrodes.

A gas inlet 20 is formed on, the upper part 2a of the processing chamber 2. The gas inlet 20 is coupled with a gas line 22. The gas line 22 is coupled with a valve 24, a mass flow controller (MFC) 28 and an etching gas source 30. The etching gas source 30 may provide the processing chamber 2 with an etching gas such as $CHF_3$, $N_2$ or Ar. The etching gas may be ejected uniformly through a hole of the top electrode 18 over the substrate W.

Meanwhile, a bottom portion of the processing chamber 2 is coupled with an exhaust line 40. The exhaust line 40 is coupled with an exhaust apparatus 42. A gate valve 46 is installed on a sidewall of the processing chamber 2. When the gate valve 46 is open, the substrate W may be carried into a loadlock chamber (not shown).

A dipole ring magnet 60 is arranged to surround a plasma-processing region outside the processing chamber 2. The dipole ring magnet 60 includes a plurality of anisotropic segment cylindrical magnets which are disposed in a ring-shaped manner. The anisotropic segment cylindrical magnets are arranged in such a manner that their magnetization directions are slightly different from one another, so as to form a horizontal magnetic field totally in one direction. The dipole ring magnet 60 causes an orthogonal electromagnetic field to be formed in the plasma-processing region and, therefore, the orthogonal electromagnetic field causes drift movements of electrons so that high-energy magnetron discharge results in to form high-density plasma. If the dipole ring magnet 60 rotates, a uniform magnetic field is formed.

Figure 2:
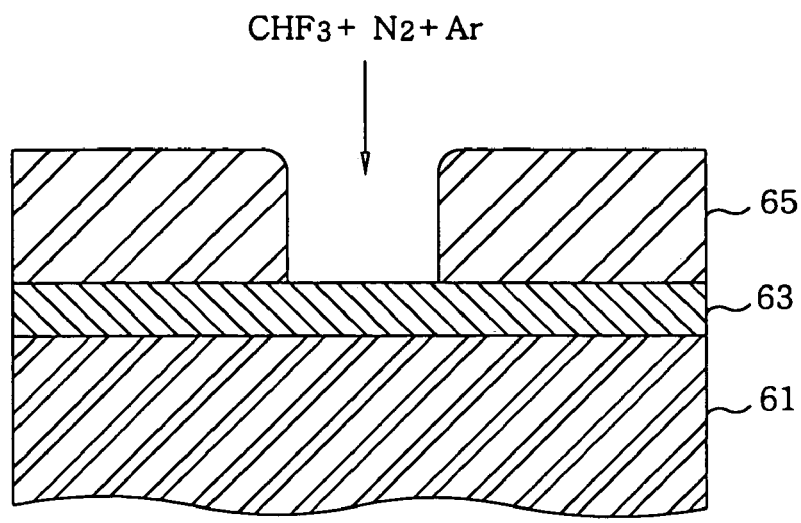
FIG. 2 illustrates a schematic cross-sectional view of a substrate to be etched.

FIG. 2 shows the substrate W having a SiO layer 61, a SiC layer coating the SiO layer 61 and a PR layer 65 coating the SiC layer 63. A process for etching the SiC layer 63 through an opening pattern of a photoresist layer 65 by using the plasma etching apparatus 1 will be described.

After the elevator 6 moves the susceptor 8 in a downward direction, the gate valve 46 is opened and the substrate W is carried into the processing chamber 2 so that the substrate W may be mounted on the electrostatic chuck 10. The gate valve 46 is closed and the elevator 6 moves the susceptor 8 in an upward direction to a processing position. After the exhaust apparatus 42 depressurizes the processing chamber 2, the valve 24 is opened so that the process chamber 2 is provided with the etching gas including $CHF_3$ from the etching gas source 30. It is preferable that the etching gas includes a material N as well as $CHF_3$. For example, a mixed gas of $CHF_3$, $N_2$ and Ar may be used as the etching gas. The pressure in the processing chamber 2 is maintained at a predetermined value, e.g., 6.66 Pa (50 mTorr). In order to obtain a higher etching rate, a ratio of $CHF_3$ flow rate with respect to $N_2$ flow rate in the etching gas is preferably in the range between about 0.2 and about 0.8, more preferably in the range between about 0.4 and about 0.8 and still more preferably in the range between about 0.4 and about 0.6.

When the dipole ring magnet 60 rotates and a voltage of high frequency power is applied to the bottom electrode, i.e., the susceptor 8, the etching gas is converted into plasma to etch the SiC layer 63 on the substrate W. Before or after the voltage of high frequency power is applied, a DC voltage from the DC power source 14 is applied to the electrode 12 in the electrostatic chuck 10 so that the electrostatic force attracts the substrate W onto the electrostatic chuck 10. An end point detector (not shown) detects luminescence intensity during the etching process. Based on the result of the detection, the etching process may be terminated.

In case of using the etching gas including $CHF_3$ to etch the SiC layer 63 as described above, the etching selectivity of the SiC layer with respect to the $SiO_2$ layer can be increased and the etching stop is less likely to occur. If $CHF_3$ and a material having N, e.g., a gas having $N_2$, are used as the etching gas, the etching rate of the SiC layer 63 increases. In this case, the etching gas of the present invention is not limited to gases having $CHF_3$ and $N_2$. That is, when the etching gas includes a material having C, H and F and a material having N but the etching gas is completely or essentially free from any material having O, the etching rate of the SiC layer 63 is considerably high.

The substrate is not limited to the structure shown in FIG. 2. That is, the present invention may be applied to the following cases: the $SiO_2$ layer is the mask layer of the SiC, both an organic layer and a Cu layer are the base layer of the SiC layer, both the SiC layer and the organic layer standing a distance apart from each other are exposed, or both the SiC layer and the $SiO_2$ layer standing a distance apart from each other are exposed. In order to etch the SiC layer selectively against the organic layer, the ratio of $CHF_3$ flow rate with respect to $N_2$ flow rate in the etching gas is preferably in the range between about 0.2 and about 0.8 and more preferably in the range between about 0.4 and about 0.6.

Experiment

The substrate shown in FIG. 2 was etched under the following conditions: the pressure in the processing chamber was maintained at 6.66 Pa (50 mTorr); a mixed gas of $CHF_3$, $N_2$ and Ar was supplied as the etching gas into the processing chamber; and a high frequency power of 500 W from the high frequency power supply with a frequency of 13.56 MHz was applied to the bottom electrode.

The ratios of $CHF_3$ flow rate with respect to $N_2$ flow rate in the etching gas were 0.2, 0.4, 0.6, 0.8 and 2.0, respectively. The Ar flow rate was maintained at 100 ml/min (sccm).

Figure 3:
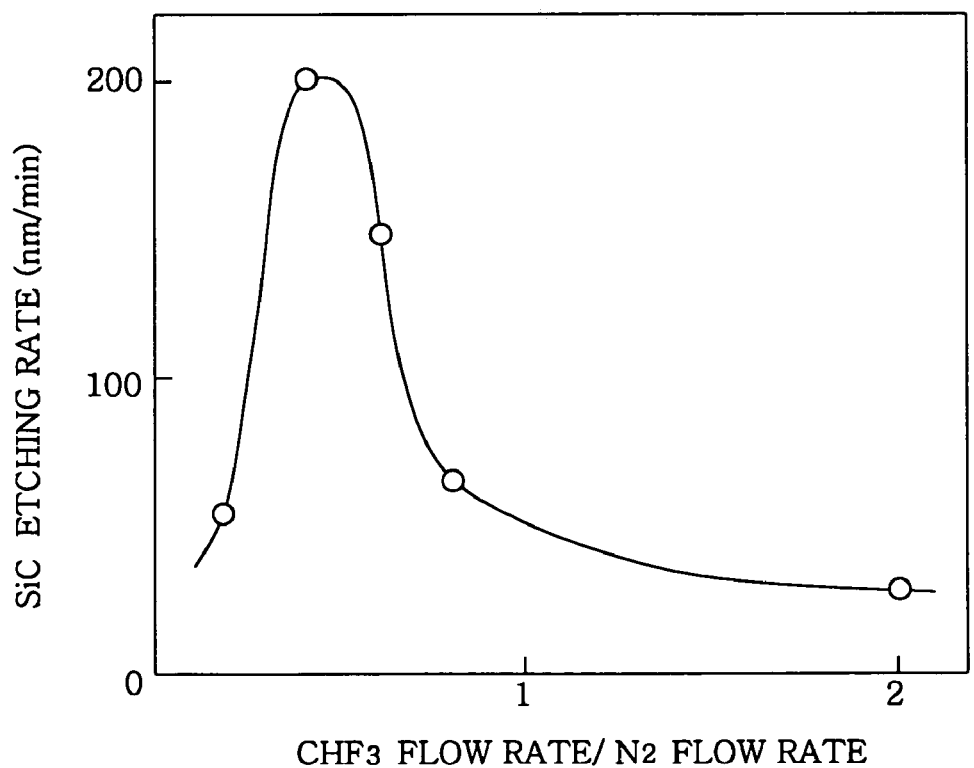
FIG. 3 describes a graphic illustration explaining a relationship between an etching rate of SiC and a ratio of $CHF_3$ flow rate with respect to $N_2$ flow rate.
Figure 4:
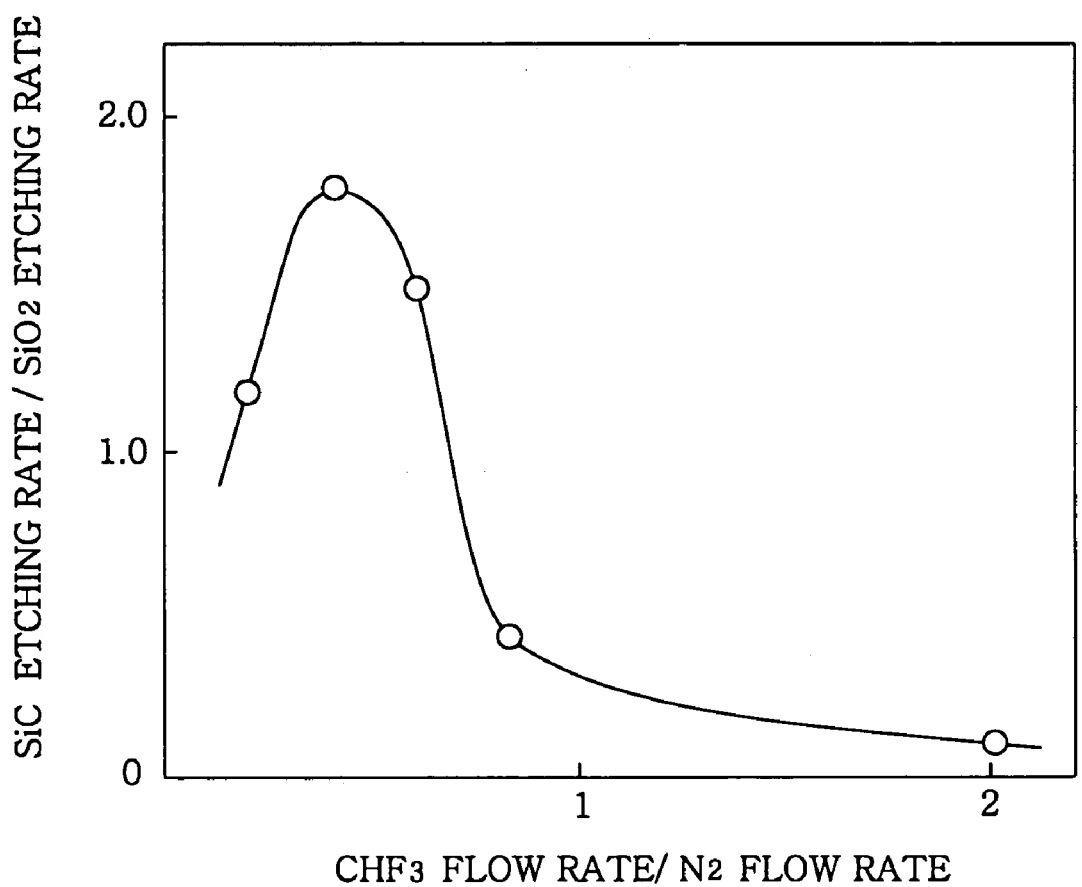
FIG. 4 is a graphic illustration showing a relationship between an etching selectivity of the SiC layer with respect to the $SiO_2$ layer and a ratio of $CHF_3$ flow rate with respect to $N_2$ flow rate.

FIG. 3 shows the etching rate of SiC layer as a function of the ratio. FIG. 4 shows the etching selectivity of the SiC layer with respect to the $SiO_2$ layer as a function of the ratio. FIG. 5 shows the etching selectivity of the SiC layer with respect to the photoresist layer as a function of the ratio.

As shown in FIG. 3, the etching rate is high when the ratio is in the range between about 0.2 and about 0.8. The etching rate is higher when the ratio is in the range between about 0.4 and about 0.8. The etching rate is still higher when the ratio is in the range between about 0.4 and about 0.6.

As shown in FIG. 4, the etching selectivity of SiC with respect to $SiO_2$ is high when the flow rate is between about 0.2 and about 0.6, and the etching selectivity is higher when the flow rate is between about 0.4 and about 0.6.

As shown in FIG. 5, the etching selectivity of SiC with respect to the photoresist is high when the flow rate is between about 0.2 and about 0.8. The etching selectivity is higher when the flow rate is between about 0.4 and about 0.6.

In another experiment, the substrate was etched under the following conditions: the pressure in the processing chamber was maintained at 6.66 Pa (50 mTorr); a mixed gas of $CF_4$ (with a flow rate of 5 ml/min(sccm)), $CH_2F_2$ (with a flow rate of 20 ml/min(sccm)), $O_2$ (with a flow rate of 15 ml/min(sccm)) and Ar (with a flow rate of 100 ml/min (sccm)) was used as the etching gas; and the high frequency power of 300 W was applied to the substrate. According to the results of the experiment, the etching rate of the SiC layer was 35 nm/min and the etching selectively of the SiC layer with respect to the $SiO_2$ layer was 1.0 while the etching selectivity of the SiC layer with respect to the photoresist layer was 0.4.

As described above, the present invention uses the etching gas having $CHF_3$ to perform a plasma etching on SiC, so that SiC may be etched selectively against $SiO_2$. When the etching gas includes $CHF_3$ and $N_2$, or when the etching gas includes a material having C, H and F and a material having N but the etching gas is completely or essentially free from any material having O, the SiC may be etched with a plasma treatment with a higher etching rate.

While the invention has been shown and described with respect to the preferred embodiments, it will be understood by those skilled in the art that various changes and modifications may be made without departing from the spirit and scope of the invention as defined in the following claims.

What is claimed is:

1. A method for plasma treatment, comprising the steps of:
   (a) arranging a substrate in a chamber, wherein the substrate includes an SiC layer and an $SiO_2$ layer; and
   (b) introducing an etching gas into the chamber and converting the etching gas into plasma to etch selectively the SiC layer against the $SiO_2$ layer, wherein the etching gas includes $CHF_3$, as a main fluorocarbon component thereof, and $N_2$,
   wherein a ratio of $CHF_3$ flow rate to $N_2$ flow rate in the etching gas is between about 0.4 and about 0.6, and
   wherein the SiC layer is etched at a rate of from 150 nm/mm or greater.

2. The method of claim 1, wherein the $SiO_2$ layer is a mask layer on the SiC layer, and wherein the mask layer has an opening pattern.

3. The method of claim 1, wherein the $SiO_2$ layer is a base layer of the SiC layer.

4. The method of claim 1, wherein the etching gas consists of $CHF_3$, $N_2$ and an inert gas.

5. The method of claim 1, wherein the SiC layer is etched at a rate of from 150 to 200 nm/min.

6. A method for plasma treatment, comprising the steps of:
   (a) arranging a substrate in a chamber, wherein the substrate includes an SiC layer; and
   (b) introducing an etching gas into the chamber and converting the etching gas into plasma to etch the SiC layer, wherein the etching gas includes $CHF_3$, as a main fluorocarbon component thereof, and $N_2$, the etching gas being essentially free from any material having O, wherein a ratio of $CHF_3$ flow rate to $N_2$ flow rate in the etching gas is between about 0.4 and about 0.6, and wherein the SiC layer is etched at a rate of from 150 nm/min or greater.

7. The method of claim 6, wherein the substrate includes an organic layer and the SiC layer is etched selectively against the organic layer.

8. The method of claim 7, wherein the organic layer is a mask layer of the SiC layer and the mask layer has an opening pattern.

9. The method of claim 7, wherein the organic layer is a base layer of the SiC layer.

10. The method of claim 7, wherein the organic layer is a dielectric layer with a lower dielectric constant.

11. The method of claim 6, wherein the substrate includes a $SiO_2$ layer and the SiC layer is etched selectively against the $SiO_2$ layer.

12. The method of claim 6, wherein a base layer of the SiC layer is a Cu layer.

13. The method of claim 6, wherein the SiC layer is etched at a rate of from 150 to 200 nm/mm.

* * * * *